US012265124B1

(12) United States Patent
Jain et al.

(10) Patent No.: US 12,265,124 B1
(45) Date of Patent: Apr. 1, 2025

(54) TEST TIME REDUCTION IN CIRCUITS WITH REDUNDANCY FLIP-FLOPS

(71) Applicant: STMicroelectronics International N.V., Geneva (CH)

(72) Inventors: Sandeep Jain, Noida (IN); Akshay Kumar Jain, Bhopal (IN); Jeena Mary George, Kattappana (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 18/474,511

(22) Filed: Sep. 26, 2023

(51) Int. Cl.
*G01R 31/319* (2006.01)
*G01R 31/317* (2006.01)
*G01R 31/3193* (2006.01)

(52) U.S. Cl.
CPC . *G01R 31/31901* (2013.01); *G01R 31/31701* (2013.01); *G01R 31/31932* (2013.01)

(58) Field of Classification Search
CPC .............. G01R 31/28; G01R 31/31901; G01R 31/31701; G01R 31/31932; G01R 31/3181; G01R 31/31816; G01R 31/31915; G06F 11/16; G06F 11/18; G06F 11/1608; H03K 19/003; H03K 19/007

See application file for complete search history.

(56) References Cited

U.S. PATENT DOCUMENTS

| | | | | |
|---|---|---|---|---|
| 11,296,700 B1 * | 4/2022 | Rao | ....................... | H03K 3/0372 |
| 11,593,542 B2 | 2/2023 | Miryala et al. | | |
| 2005/0125749 A1 * | 6/2005 | Goodnow | ............... | G06F 30/30 |
| | | | | 716/103 |
| 2011/0022908 A1 | 1/2011 | Wang | | |
| 2011/0022909 A1 | 1/2011 | Wang et al. | | |
| 2011/0209021 A1 * | 8/2011 | Sorensen | ................. | A61B 7/04 |
| | | | | 714/E11.155 |

FOREIGN PATENT DOCUMENTS

| | | |
|---|---|---|
| CN | 110083492 A | 8/2019 |
| EP | 4261550 A1 | 10/2023 |
| JP | 2010041705 A | 2/2010 |

OTHER PUBLICATIONS

Dr. Kiyoo Itoh, et al., "Springer Series in Advanced Microelectronics," Springer Series in Advanced Microelectronics, vol. 41, Publication Date:Oct. 29, 2013, 89 pages.

(Continued)

*Primary Examiner* — Shelly A Chase
(74) *Attorney, Agent, or Firm* — Slater Matsil, LLP

(57) ABSTRACT

According to an embodiment, a digital circuit with N number of redundant flip-flops is provided, each having a data input coupled to a common data signal. The digital circuit operates in a functional mode and a test mode. During test mode, a first flip-flop is arranged as part of a test path and N−1 flip-flops are arranged as shadow logic. A test pattern at the common data signal is provided and a test output signal is observed at an output terminal of the first flip-flop to determine faults within a test path of the first flip-flop. At the same cycle, the test output signals of each of the N−1 number of redundant flip-flops is observed through the functional path to determine faults.

20 Claims, 7 Drawing Sheets

(56) References Cited

OTHER PUBLICATIONS

Kouji Shinohara et al., "A Double or Triple Module Redundancy Model Exploiting Dynamic Reconfigurations," 2008 NASA/ESA Conference on Adaptive Hardware and Systems, Jun. 22-25, 2008, 12 pages.

Nihar Hage, et al., "In-Situ Monitoring for Slack Time Violation Without Performance Penalty," In-situ Monitoring for Slack Time Violation Without Performance Penalty, IEEE Conference Publication, IEEE Xplore, 2018 IEEE International Symposium on Circuits and Systems (ISCAS), May 27-30, 2018, 7 pages.

Padmapriya K., et al., "Improving Test Coverage of Hi-Reliability ASIC Designs with Test Point Insertion for Space Applications," Proceedings of the International Conference on Smart Electronics and Communication (ICOSEC 2020), IEEE Xplore Part No. CFP20V90-ART; Sep. 2020, 5 pages.

Rajendra Bishnoi, et al., "Design of Defect and Fault-Tolerant Nonvolatile Spintronic Flip-Flops," Design of Defect and Fault-Tolerant Nonvolatile Spintronic Flip-Flops, IEEE Journals & Magazine, IEEE Xplore, IEEE Transactions on Very Large Scale Integration (VLSI) Systems ( vol. 25, Issue: 4, Apr. 2017), 22 pages.

Ghahroodi , Massoud Mokhtarpour et al., "Radiation Hardening By Design: A Novel Gate Level Approach," 2011 NASA/ESA Conference on Adaptive Hardware and Systems (AHS-2011), Jun. 6, 2011, 6 pages.

Extended European search report, Application No. 24198201.6, mailed Feb. 4, 2025, 33 pages.

\* cited by examiner

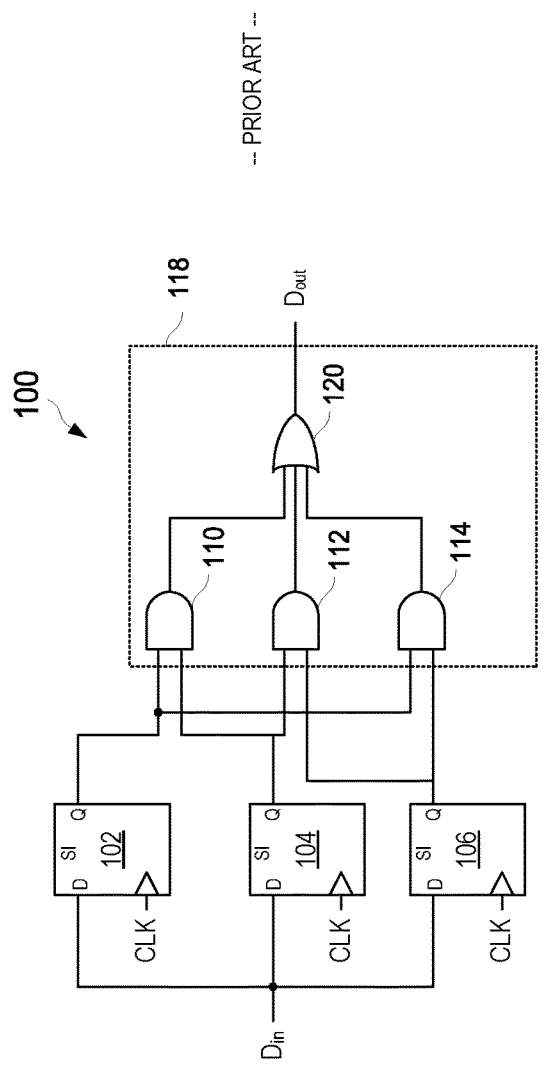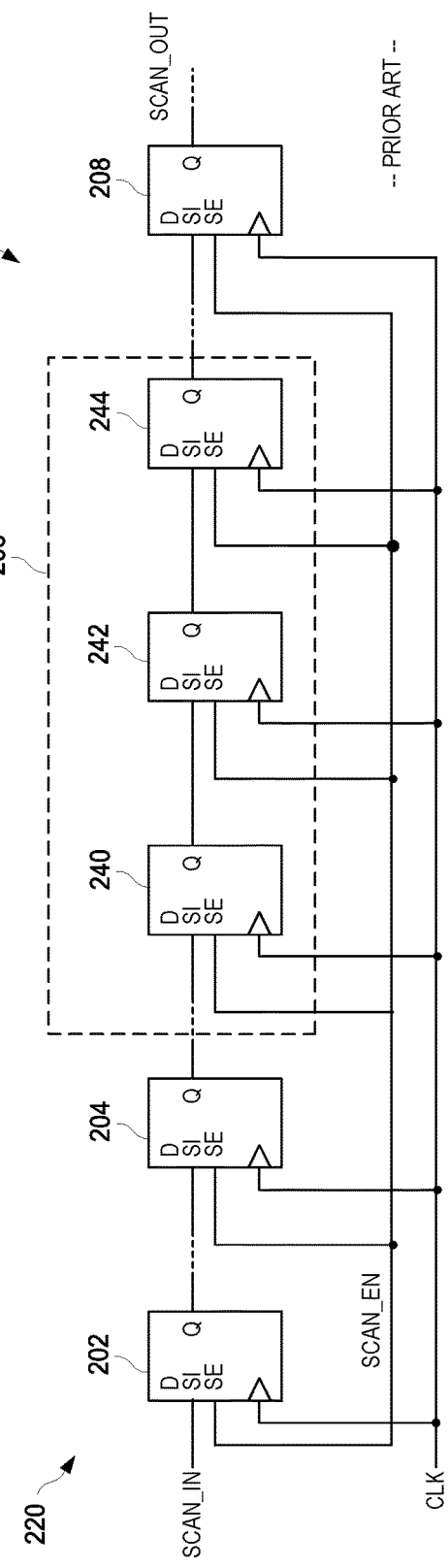
FIG. 1
FIG. 2

-- PRIOR ART --

# TEST TIME REDUCTION IN CIRCUITS WITH REDUNDANCY FLIP-FLOPS

TECHNICAL FIELD

The present disclosure generally relates to design for test and, in particular embodiments, to test time reduction in circuits using redundancy flip-flops.

BACKGROUND

Integrated circuits (ICs) are generally tested for faults. In particular, the logic circuits of the integrated circuit are commonly tested using a method often referred to as scan testing. During scan testing, test patterns are shifted in through one or more chains of flip-flops (i.e., scan chains) to stimulate one or more logic circuits. Results from the stimulated logic circuits are loaded into the scan chains and are shifted out for evaluation. When the shifted-out patterns match expected patterns (based on the proper functioning of one or more logic circuits), no faults are detected, and the circuit may be defect-free. Faults are detected when the shifted-out patterns do not match the expected patterns.

An exemplary type of circuit with redundant flip-flops is a triple-voting flop (TVF). A triple-voting flop is a type of logic that uses a fault-tolerant design technique commonly used in safety-critical systems where single faults could lead to hazardous or unsafe conditions. Three redundant circuit versions are implemented, and their outputs are compared to detect and mitigate potential errors. A triple-voting flop uses majority voting to determine the output. For example, when all flip-flops of a triple voting flop are operating properly, the content of each flip-flop is the same, and the output is equal to the content of the flip-flops. If one of the flip-flops of the triple-voting flop outputs a wrong state, the output of the triple-voting flop remains correct (since the two other flip-flops output the correct value).

Thus, the redundancy and voting mechanisms in the triple-voting flop implementation provide fault tolerance. Even if one of the flip-flops becomes faulty, the system can still function correctly if the other two are operational and consistent. Triple-voting flops can robustly detect and mitigate errors and faults, ensuring the system remains reliable despite various environmental stressors and hardware faults.

Further, triple-voting flops can be used as a security measure to protect systems and data from unauthorized attacks and breaches and monitor critical components of the system. If an unauthorized access or tampering attempt is made, inconsistencies in the outputs of the triple voting flop could signal the presence of tampering. Triple-voting flops could be employed as part of the verification process for critical boot components. In which case, any inconsistencies detected among the triple voting flop outputs could indicate potential tampering or corruption of, for example, the boot code.

Replacing a single flip-flop with a triple-voting flop can increase the test time in testing. This is primarily because the triple-voting flop involves a voting mechanism and requires three flip-flops to implement. In a standard test cycle for a single flip-flop, one would generally need just one shift cycle to capture the output of the flip-flop. However, in the case of the standard testing of a triple-voting flop, three shift cycles are typically required to capture the outputs of all three flip-flops. This inherently triples the number of clock cycles required for testing.

Thus, while circuits with redundant flip-flops can provide increased reliability and fault tolerance, they have come with the trade-off of potentially longer test times. The overall testing duration has expanded with the growing adoption of circuits with redundant flip-flops within industries such as automotive. It is, thus, desirable to provide an improved test structure and method of operation to reduce test time in circuits using redundancy flip-flops.

SUMMARY

Technical advantages are generally achieved by this disclosure's embodiments, which describe test time reduction in circuits using redundancy flip-flops.

A first aspect relates to a digital circuit that includes N number of redundant flip-flops. Each of the N number of redundant flip-flops has a data input coupled to a common data signal. The digital circuit is configured to operate in a functional mode corresponding to the regular operation of the digital circuit and a test mode corresponding to the testing of various paths of the digital circuit. During the functional mode, the digital circuit is configured to combine a functional output signal of each of the N number of redundant flip-flops using logic gates and provide a single functional output signal in a fault-tolerant, safety-critical system based on the combining. During the test mode, the digital circuit is configured to arrange a first flip-flop of the N number of redundant flip-flops as part of a test path; arrange N−1 number of the N number of redundant flip-flops as shadow logic by bypassing the N−1 number of the N number of redundant flip-flops from the test path, the N number of redundant flip-flops receiving a test pattern at the common data signal; observe a test output signal at an output terminal of the first flip-flop to determine faults within a test path comprising the first flip-flop; and observe test output signals of each of the N−1 number of redundant flip-flops to determine faults within the N−1 number of redundant flip-flops, the test output signal at the output terminal of the first flip-flop and the test output signals of each of the N−1 number of redundant flip-flops are observed at a same test cycle.

A second aspect relates to an integrated circuit that includes a digital circuit. The digital circuit includes N number of redundant flip-flops. Each of the N number of redundant flip-flops has a data input coupled to a common data signal. The digital circuit is configured to operate in a functional mode corresponding to a regular operation of the digital circuit and a test mode corresponding to testing of various paths of the digital circuit. During the functional mode, the digital circuit is configured to combine a functional output signal of each of the N number of redundant flip-flops using logic gates and provide a single functional output signal in a fault-tolerant, safety-critical system based on the combining. During the test mode, the digital circuit is configured to arrange a first flip-flop of the N number of redundant flip-flops as part of a test path; arrange N−1 number of the N number of redundant flip-flops as shadow logic by bypassing the N−1 number of the N number of redundant flip-flops from the test path, the N number of redundant flip-flops receiving a test pattern at the common data signal; observe a test output signal at an output terminal of the first flip-flop to determine faults within a test path comprising the first flip-flop; and observe test output signals of each of the N−1 number of redundant flip-flops to determine faults within the N−1 number of redundant flip-flops, the test output signal at the output terminal of the first flip-flop and the test output signals of each of the N−1 number of redundant flip-flops are observed at a same test cycle.

A third aspect relates to a method of operating a digital circuit having N number of redundant flip-flops, each of the N number of redundant flip-flops having a data input coupled to a common data signal. The method includes operating the digital circuit in a functional mode corresponding to a regular operation of the digital circuit and operating the digital circuit in a test mode corresponding to testing various paths of the digital circuit. During the functional mode, the method includes combining a functional output signal of each of the N number of redundant flip-flops using logic gates and providing a single functional output signal in a fault-tolerant, safety-critical system based on the combining. During the test mode, the method includes arranging a first flip-flop of the N number of redundant flip-flops as part of a test path; arranging N−1 number of the N number of redundant flip-flops as shadow logic by bypassing the N−1 number of the N number of redundant flip-flops from the test path, the N number of redundant flip-flops receiving a test pattern at the common data signal; observing a test output signal at an output terminal of the first flip-flop to determine faults within a test path comprising the first flip-flop; and observing test output signals of each of the N−1 number of redundant flip-flops to determine faults within the N−1 number of redundant flip-flops, wherein observing the test output signal at the output terminal of the first flip-flop and the test output signals of each of the N−1 number of redundant flip-flops are during a same test cycle.

Embodiments can be implemented in hardware, software, or any combination thereof.

BRIEF DESCRIPTION OF THE DRAWINGS

For a more complete understanding of the present disclosure and the advantages thereof, reference is now made to the following descriptions taken in conjunction with the accompanying drawings in which:

FIG. 1 is a schematic of an exemplary triple-voting flop (TVF), an example of a redundancy circuit;

FIG. 2 is a schematic of an embodiment integrated circuit;

DETAILED DESCRIPTION OF ILLUSTRATIVE EMBODIMENTS

Figure 3:
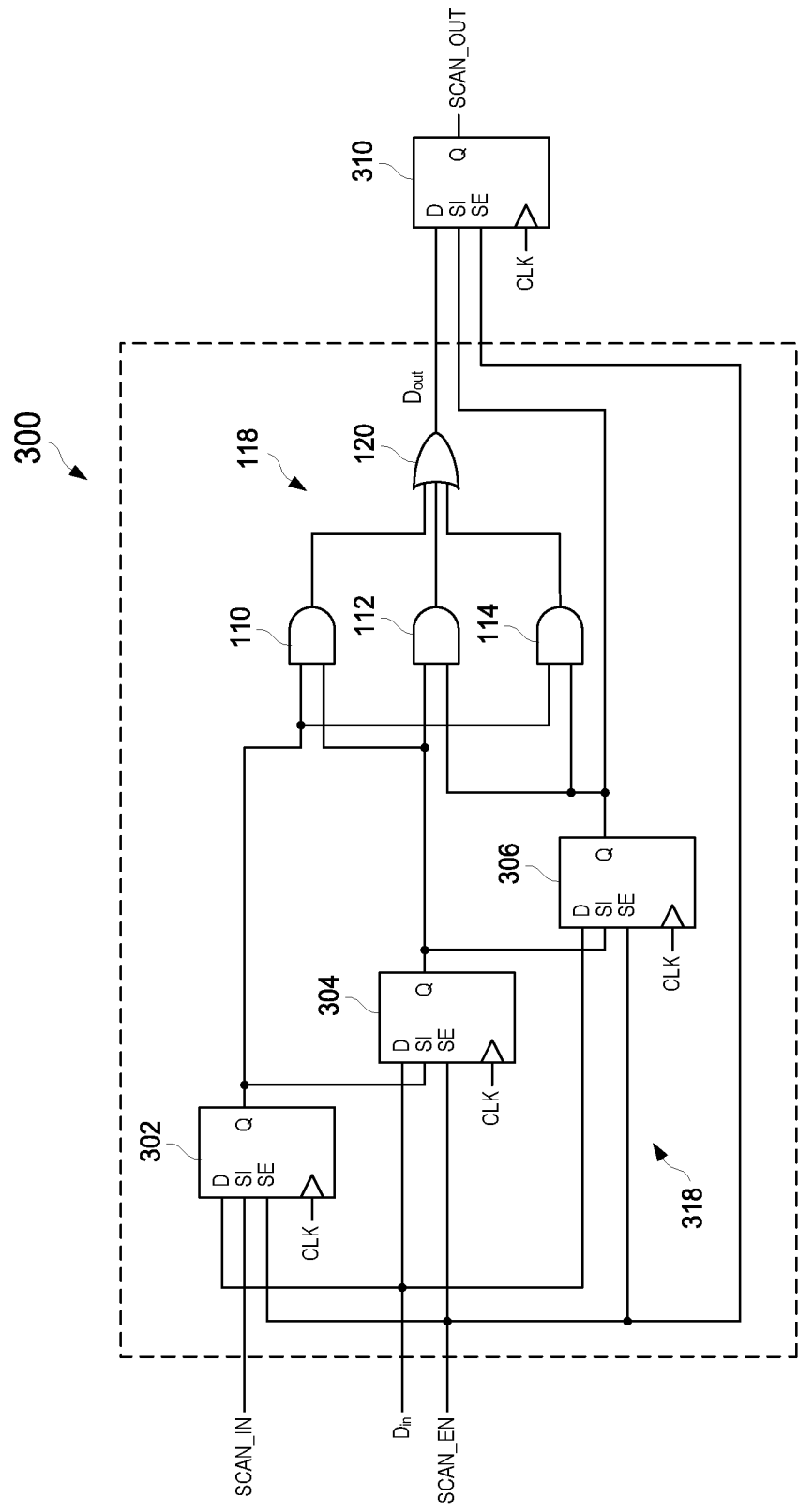
FIG. 3 is a schematic of an exemplary triple-voting flop using scan flip-flops.

This disclosure provides many applicable inventive concepts that can be embodied in a wide variety of specific contexts. The particular embodiments are merely illustrative of specific configurations and do not limit the scope of the claimed embodiments. Features from different embodiments may be combined to form further embodiments unless noted otherwise. Various embodiments are illustrated in the accompanying drawing figures, where identical components and elements are identified by the same reference number, and repetitive descriptions are omitted for brevity. Variations or modifications described in one of the embodiments may also apply to others. Further, various changes, substitutions, and alterations can be made herein without departing from the spirit and scope of this disclosure as defined by the appended claims.

While the inventive aspects are described primarily in the context of triple-voting flops (TVFs) and in-situ monitor (I2SM) circuits, it should be appreciated that these inventive aspects may also apply to any logic circuit that utilizes redundancy-type flip-flops where the same data is copied as input into multiple flip-flops and converge out as a single output at a single node. In particular, this disclosure may similarly apply to the design for testing in digital structures employing redundancy-type flip-flops instead of a single flip-flop to improve system robustness while minimizing any resulting increase in test time due to the addition of the other logic without impacting the functional paths of the circuit.

In embodiments, an integrated circuit, a digital circuit with redundant flip-flops, and method of operation are proposed. The digital circuit of the integrated circuit includes N number of redundant flip-flops. Each of the N number of redundant flip-flops has a data input coupled to a common data signal. The digital circuit is configured to operate in a functional mode corresponding to the regular operation of the digital circuit and a test mode corresponding to the testing of various paths of the digital circuit. During the functional mode, the digital circuit is configured to combine a functional output signal of each of the N number of redundant flip-flops using logic gates and provide a single functional output signal in a fault-tolerant, safety-critical system based on the combining. During the test mode, the digital circuit is configured to arrange a first flip-flop of the N number of redundant flip-flops as part of a test path; arrange N−1 number of the N number of redundant flip-flops as shadow logic by bypassing the N−1 number of the N number of redundant flip-flops from the test path, the N number of redundant flip-flops receiving a test pattern at the common data signal; observe a test output signal at an output terminal of the first flip-flop to determine faults within a test path comprising the first flip-flop; and observe test output signals of each of the N−1 number of redundant flip-flops to determine faults within the N−1 number of redundant flip-flops, the test output signal at the output terminal of the first flip-flop and the test output signals of each of the N−1 number of redundant flip-flops are observed at a same test cycle. These and further details are discussed in greater detail below.

FIG. 1 illustrates a schematic of an exemplary triple-voting flop (TVF) 100, an example of a redundancy circuit. Triple-voting flop 100 includes a first flip-flop 102, a second flip-flop 104, a third flip-flop 106, and a voting circuit 118. Voting circuit 118 includes AND gates 110, 112, 114, and OR gate 120.

Triple-voting flop 100 uses majority voting to determine the output ($D_{out}$). For example, when all flip-flops 102, 104, and 106 are operating properly, the content of each flip-flop 102, 104, 106 is the same, and the output ($D_{out}$) is equal to the content of flip-flops 102, 104, 106. If one of flip-flops 102, 104, 106 outputs a wrong state, output ($D_{out}$) continues to output the correct value (since the two other flip-flops output the correct value).

For example, if the first flip-flop 102 and the second flip-flop 104 output a logic '1' and the third flip-flop 106 flips and outputs a logic '0', the output of AND gate 110 is a logic '1', the output of each of AND gates 112 and 114 is a logic '0', and the output of OR gate 120 is a logic '1'. If the first flip-flop 102 and the second flip-flop 104 output a logic '0' and the third flip-flop 106 flips and outputs a logic '1', the output of AND gates 110, 112, and 114 is a logic '0', and the output of OR gate 120 is a logic '0'.

FIG. 2 illustrates a schematic of an embodiment integrated circuit 200. Integrated circuit 200 includes the scan chain 220. Scan chain 220 includes the triple-voting flop 206 and scan flip-flops 202, 204, and 208.

When the triple-voting flop 206, such as the triple-voting flop 106, replaces a single flip-flop of the scan chain 220 (e.g., for redundancy), three scan shift cycles (i.e., two additional cycles) are typically required to shift the triple-voting flop 206. Adding a scan shift cycle during the scan test impacts the load/unload and, thus, the test time. Further, the addition of the scan shift cycle impacts the self-test time when the integrated circuit 200 is operating in-field within the LBIST partitions.

Integrating triple-voting flops, such as the triple-voting flop 206, into integrated circuits within the automotive sector is experiencing a notable increase, primarily driven by adopting Automotive Safety Integrity Level (ASIL) standards. These standards significantly impact the automotive industry, particularly for critical systems such as airbags, anti-lock brakes, and power steering. Such systems necessitate the highest ASIL level, ASIL-D, due to the potentially severe consequences of their failure. Conversely, components like rear lights, which bear a lower safety risk, adhere to ASIL-A standards. Intermediate safety levels apply to components like headlights and brake lights (ASIL-B) and cruise control (ASIL-C). Similar trends are observed in other industries, such as medical, defense, and aerospace, where redundancy-based circuitry, such as triple voting flops, address diverse safety and security prerequisites.

Experts in the field have approximated that approximately 5 to 8% of all flip flops in digital circuits will be of the triple voting flop variant. Assuming a 5% penetration of triple-voting flops, this introduction would lead to a minimum 10% increase in test time, as each triple-voting flop adds two additional scan flip-flops. Embodiments of this disclosure provide an improved structure and method for testing scan chain 220 using less than three shift cycles for each triple-voting flop in the integrated circuit 200. And, as a generalization, embodiments of this disclosure provide an improved structure and method for testing a logic circuit that utilizes redundancy-type flip-flops where the same data is copied as input into multiple flip-flops and converges out as a single output at a single node. In such embodiments, a single shift cycle for each redundant flip-flop is sufficient to provide full test coverage to the logic circuit instead of requiring a shift cycle for each redundant flip-flop.

FIG. 3 illustrates a schematic of an exemplary triple-voting flop 300 using scan flip-flops. Triple-voting flop 300 is structurally similar to triple-voting flop 100. Triple-voting flop 300, however, replaces the first flip-flop 102, the second flip-flop 104, and the third flip-flop 106, respectively, with a first scan flip-flop 302, a second scan flip-flop 304, and a third scan flip-flop 306. The scan flip-flops 302, 304, 306, and 310 are coupled to form a portion of a scan chain 318. Fourth scan flip-flop 310 is used to capture the output of the OR gate 120.

For each scan flip-flop, when a scan enable signal (SCAN_EN) is de-asserted (e.g., logic level low) at a scan enable input (SE), the scan flip-flop latches the content of the data input signal ($D_{in}$) at the data input (D). It outputs the latched content at the output (Q) at each clock pulse of the clock signal (CLK) at a clock input of the scan flip-flop. When the scan enable signal (SCAN_EN) is asserted (e.g., logic level high) at the scan enable input (SE), the scan flip-flop latches the content of the scan in input signal (SCAN_IN) at the scan in input (SI) and outputs the latched content at the output (Q) at each clock pulse of the clock signal (CLK) at the clock input of the scan flip-flop. In normal operating modes, the scan enable signal (SCAN_EN) is de-asserted, and the triple-voting flop 300 operates similarly to the triple-voting flop 100.

In launch-on-capture testing and in scan mode, during a shift pulse, test patterns are first loaded using the scan in input signal (SCAN_IN) into the first scan flip-flop 302, the second scan flip-flop 304, and the third scan flip-flop 306. During a launch pulse, the first scan flip-flop 302, the second scan flip-flop 304, and the third scan flip-flop 306 latch the same content of the data input signal ($D_{in}$) and output a respective output (Q). During a capture pulse, the output of the OR gate 120 is captured by the fourth scan flip-flop 310, which is then shifted out with further shift pulses and compared with an expected output to determine whether the triple-voting flop 300 includes faults.

Disadvantageously, the launch-on-capture testing may fail to provide complete at-speed scan coverage (fault coverage of about 30%). For example, a slow-to-rise fault may be undetectable at the first scan flip-flop 302 during at-speed scan testing. In particular, during the shift pulse, to test a slow-to-rise fault at the output of the first scan flip-flop 302, the first scan flip-flop 302 is loaded with a logic '0'. During the launch pulse, the data input ($D_{in}$) provides a logic '1' to the first scan flip-flop 302, the second scan flip-flop 304, and the third scan flip-flop 306. If the first scan flip-flop 302 is slow to rise but the second scan flip-flop 304 and the third scan flip-flop 306 are operating properly, the slow-to-rise fault of the first scan flip-flop 302 is masked by the presence of the logic '1' at the outputs of the second scan flip-flop 304 and the third scan flip-flop 306.

In launch-on-shift testing and in scan mode, during a shift pulse, test patterns are first loaded using the scan in input signal (SCAN_IN) into the first scan flip-flop 302, the second scan flip-flop 304, and the third scan flip-flop 306. During a last shift/launch pulse, the content of each of the first scan flip-flop 302, the second scan flip-flop 304, and the third scan flip-flop 306 is output at an output (Q). During a capture pulse, the output of the OR gate 120 is captured by the fourth scan flip-flop 310, which is then shifted out and compared with an expected output to determine whether the triple-voting flop 300 includes faults.

Disadvantageously, the launch-on-shift testing may fail to provide complete at-speed scan coverage (fault coverage of about 70%). For example, a slow-to-fall fault may be undetectable at the first scan flip-flop 302 during at-speed scan testing. In particular, during the shift pulse (to cause the output of the fourth scan flip-flop 310 to be a logic '1'), to test a slow-to-rise fault at the output of the first scan flip-flop 302, the first scan flip-flop 302 and the second scan flip-flop 304 are loaded with a logic '1'. During the last shift/launch pulse, the first scan flip-flop 302 is loaded with a logic '0', which causes the first scan flip-flop 302 to transition from a logic '1' to a logic '0' and the outputs of the second scan flip-flop 304 and the third scan flip-flop 306 to remain at logic '1'. This results in the output of the OR gate 120 remaining at a logic '1'. If the first scan flip-flop 302 is slow to fall but the second scan flip-flop 304 and the third scan flip-flop 306 are operating properly, the slow-to-fall fault of the first scan flip-flop 302 is masked and may be undetectable.

Figure 4:
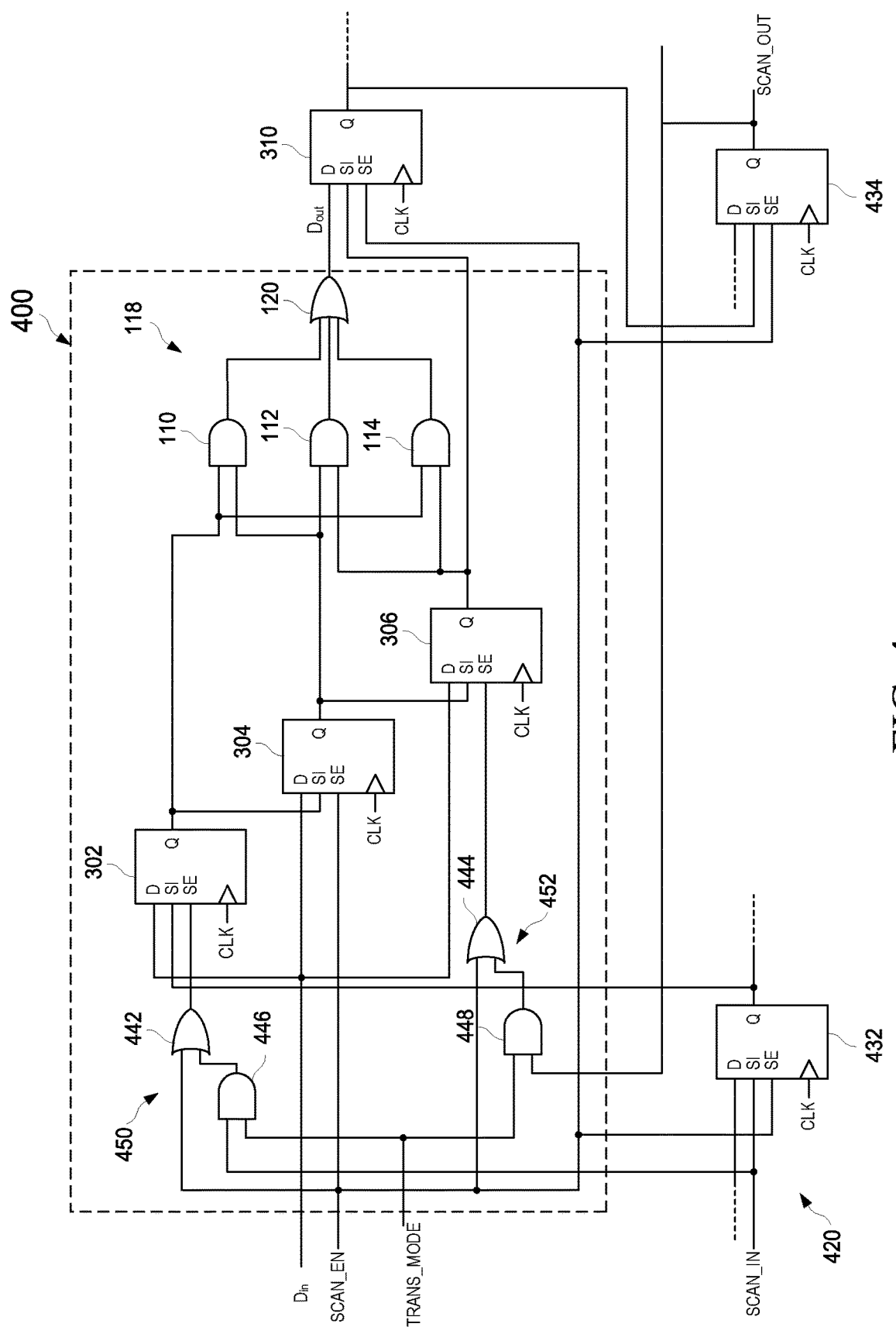
FIG. 4 is a schematic of a triple-voting flop using scan flip-flops.

FIG. 4 illustrates a schematic of a triple-voting flop 400 using scan flip-flops. Triple-voting flop 400 is structurally similar to triple-voting flop 300. However, triple-voting flop 400 includes a first flip-flop 432, a second flip-flop 434, a first scan enable control circuit 450, and a second scan enable control circuit 452. The first scan enable control circuit 450 includes a first AND gate 446 and a first OR gate 442. The second scan enable control circuit 452 includes a second AND gate 448 and a second OR gate 444. The first scan flip-flop 302, the second scan flip-flop 304, the third scan flip-flop 306, and the fourth scan flip-flop 310 are coupled to form a portion of scan chain 420, which includes the first flip-flop 432 and the second flip-flop 434.

During normal operation, where triple-voting flop 400 operates similarly to the triple-voting flop 300, and the scan enable signal (SCAN_EN) and the trans-mode signal (TRANS_MODE) are de-asserted (e.g., logic level low).

During the launch-on-capture testing and in scan mode, by keeping the trans-mode signal (TRANS_MODE) de-asserted, the triple-voting flop 400 operates similarly to the triple-voting flop 300, as the scan enable input (SE) of each of the first scan flip-flop 302, the second scan flip-flop 304, the third scan flip-flop 306, and the fourth scan flip-flop 310 receives the scan enable signal (SCAN_EN).

However, when the trans-mode signal (TRANS_MODE) is asserted (e.g., logic level high), the scan enable inputs (SE) of the first scan flip-flop 302 and the third scan flip-flop 306 are selectively controlled, respectively, based on the scan in input (SI) of the first flip-flop 432 and the output (Q) of the second flip-flop 434. As such, the content of the first scan flip-flop 302, the second scan flip-flop 304, and the third scan flip-flop 306 are independently controlled to improve at-speed scan coverage.

Figure 5:
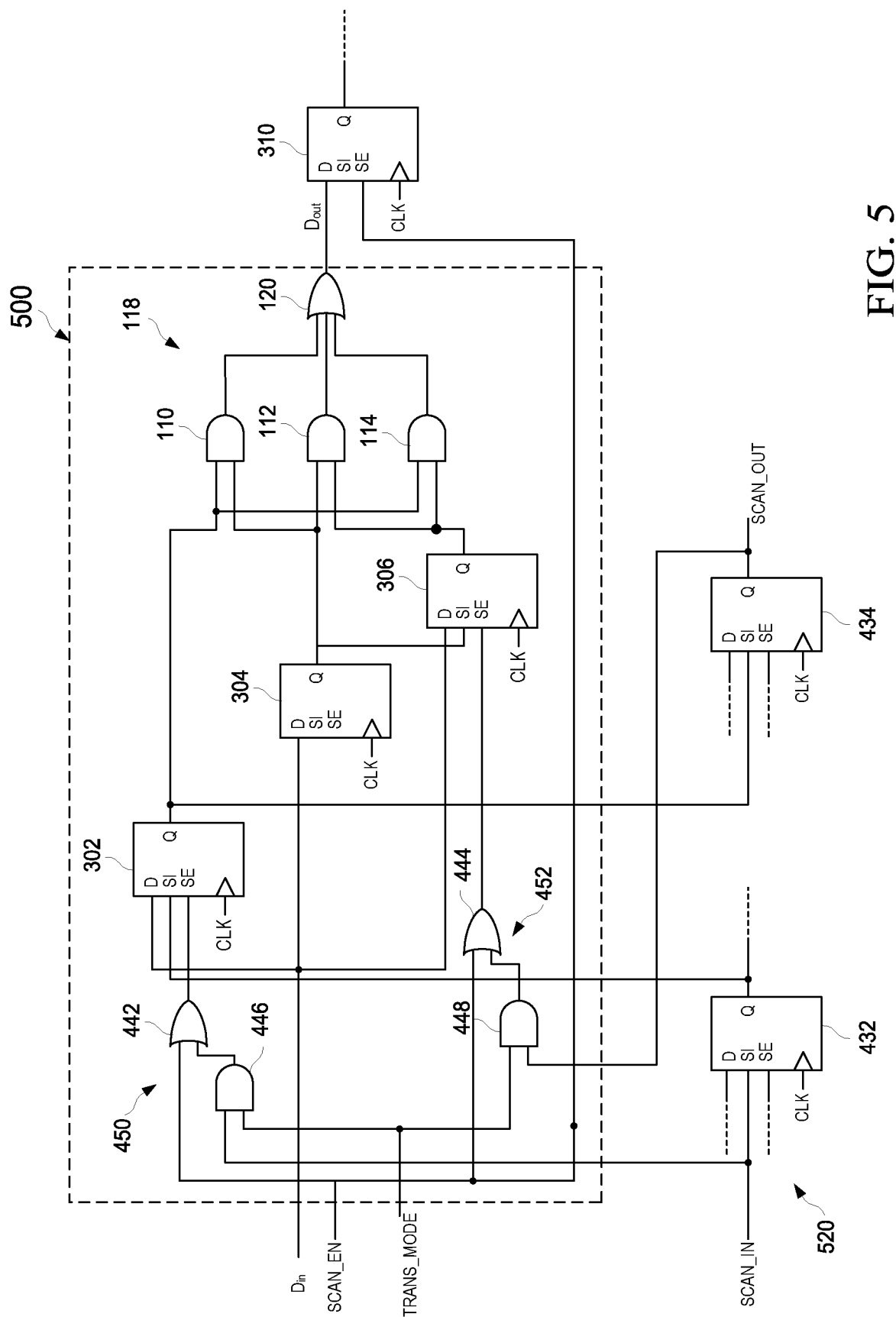
FIG. 5 is a schematic of an embodiment triple-voting flop of an integrated circuit using scan flip-flops.

FIG. 5 illustrates a schematic of an embodiment triple-voting flop 500 of an integrated circuit using scan flip-flops. Triple-voting flop 500 includes the same components as triple-voting flop 400. However, in contrast to the triple-voting flop 400, where the output (Q) of the first scan flip-flop 302 is fed to the scan in input (SI) of the second scan flip-flop 304, in the triple-voting flop 500, the output (Q) of the first scan flip-flop 302 is directly fed to the scan in input (SI) of the second flip-flop 434. Thus, the output (Q) of the first scan flip-flop 302 bypasses the second scan flip-flop 304 and the third scan flip-flop 306 in the triple-voting flop 500. Triple-voting flop 500 may include additional components not shown or may be arranged in a different configuration than that in FIG. 5.

Although the second scan flip-flop 304 and the third scan flip-flop 306 are placed outside the main scan chain 520, they remain coupled to the scan path. For example, during scan mode, the output (Q) of the second scan flip-flop 304 is fed to the scan in input (SI) of the third scan flip-flop 306. Further, the scan enable input (SE) of the third scan flip-flop 306 receives the scan enable signal (SCAN_EN) from the second OR gate 444. In embodiments, functional data is provided to the data input (D) of the second scan flip-flop 304, which is then passed on to the data input (D) of the third scan flip-flop 306. As such, the loading and unloading time for scan chain 520 equals the loading and unloading time of a scan chain without a triple voting flop, as the second scan flip-flop 304 and the third scan flip-flop 306 do not come into the loading path.

Thus, although the second scan flip-flop 304 and the third scan flip-flop 306 are not observed during the scan shift mode, the functional path will be effectively used for the observation during the scan capture mode. Accordingly, to retain coverage for the second scan flip-flop 304 and the third scan flip-flop 306, the output of the fourth scan flip-flop 310 is observed and compared to the expected results to verify the proper functioning of the second scan flip-flop 304 and the third scan flip-flop 306 at the beginning of the capture mode or the end of the scan shift mode.

In embodiments, the second scan flip-flop 304 and the third scan flip-flop 306 are arranged as shadow logic (i.e., they are not directly accessed but retain valid data, which is borrowed from the data input signal ($D_{in}$) path; in contrast to the scan in input signal (SCAN_IN) path). In embodiments, the second scan flip-flop 304 is deactivated, and the third scan flip-flop 306 is tested as shadow logic. In embodiments, the third scan flip-flop 306 is deactivated, and the second scan flip-flop 304 is arranged as shadow logic.

Advantageously, the bypassing of the second scan flip-flop 304 and the third scan flip-flop 306 in the triple-voting flop 500 allows for a single shift cycle to test the first scan flip-flop 302 of the triple-voting flop 500. Further, as the modification only applies to scan mode, there is no impact on the functional path of the integrated circuit implementing the triple-voting flop 500. Moreover, although the second scan flip-flop 304 and the third scan flip-flop 306 are not directly loaded from the scan in input signal (SCAN_IN) path during scan mode, they are loaded from the data input signal ($D_{in}$) path at the end of the scan shift mode, which includes identical data—the data input (D) of all three scan flip-flops of the triple-voting flop 500 are identical. Accordingly, complete test coverage is achieved with the proposed modified structure.

Advantageously, the terminal scan paths (i.e., flip-flops that are arranged immediately before and immediately after the triple voting flop) are reused to override the scan enable signal (SCAN_EN) and provide chain re-ordering, which results in minimal impact on scan stitching. All additional logic nodes are tested (i.e., no new nodes are introduced that are untested due to this proposed design for test structure).

Figure 6:
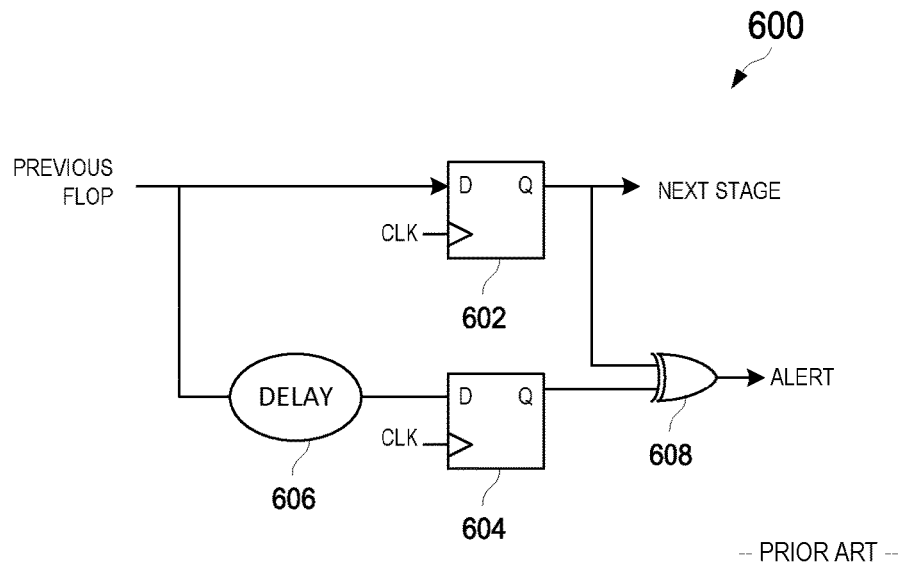
FIG. 6 is a schematic of an in-situ monitor circuit based on shadow latching for detecting timing errors implemented as an example Canary implementation.

FIG. 6 illustrates a schematic of an in-situ monitor circuit 600 based on shadow latching for detecting timing errors implemented as an example Canary implementation. Generally, in-situ monitor circuits can detect aging, voltage drops, or temperature effects in critical paths and operate as a monitoring mechanism that runs in parallel with the functional operation of the integrated circuit implementing the in-situ monitor circuit. The primary purpose of an in-situ monitor circuit is to assess the health and performance of the critical paths of the integrated circuit in real-time without disrupting its functional operation.

An in-situ monitor circuit is configured to track the behavior of specific critical paths in the integrated circuit. These paths might be susceptible to aging effects, voltage drops, or temperature-related variations that could impact their performance over time. In-situ monitor circuits may include sensors (not shown) that measure parameters like voltage levels, temperature, and signal propagation delays within the critical paths. These sensors are strategically placed to capture relevant data. The sensors continuously collect data related to the monitored parameters. This data might be analog or digital, depending on the design of the monitor circuit.

The collected data is then processed by dedicated monitoring logic of the in-situ monitor circuit. This logic compares the measured parameters against predetermined thresholds or reference values. If the monitored parameters deviate beyond acceptable limits due to, for example, aging, voltage drops, or temperature effects, the monitoring logic detects an anomaly.

When detecting an anomaly, the monitoring logic raises an early flag or an alert. This alert indicates that the critical path is experiencing adverse effects. These early warnings allow system operators or maintenance personnel to take corrective actions before the issues lead to a functional failure or reduced performance. The flagged anomalies can be logged, and relevant data might be collected for further analysis. This data can aid in understanding the specific nature and extent of the aging, voltage drops, or temperature effects.

Crucially, the in-situ monitor circuit is designed to operate without negatively impacting the functional operation of the integrated circuit. The monitoring sensors and logic are carefully integrated to avoid interfering with the main signals and operations of the critical paths. The monitor circuit should not introduce additional delays or distortions that could impact the circuit's intended functionality.

In-situ monitor circuit 600 includes a regular flip-flop 602, a shadow flip-flop 604, a delay chain 606, and an XOR gate 608. Regular flip-flop 602 can be a timing-critical flip-flop. Regular flip-flop 602 directly receives data from a previous stage (i.e., PREVIOUS STAGE). In contrast, shadow flip-flop 604 receives a slightly delayed signal corresponding to the data from the previous stage. The slight delay is equal to the delay accounted for in the design and provided by delay chain 606. XOR gate 608 receives the output (Q) from regular flip-flop 602 at a first input terminal and compares the value to the output (Q) from shadow flip-flop 604 at a second input terminal.

When regular flip-flop 602 is operating correctly, shadow flip-flop 604 holds the same value as regular flip-flop 602, and the output of XOR gate 608 is at a logic level low (i.e., alert signal (ALERT) is '0'). In contrast, when the values latched in regular flip-flop 602 and shadow flip-flop 604 do not match, the output of XOR gate 608 is at a logic level high, and a timing error is detected (i.e., alert signal (ALERT) is '1').

Similar to the triple-voting flop 100, which includes redundant flip-flops, in-situ monitor circuit 600 includes multiple flip-flops (i.e., regular flip-flop 602 and shadow flip-flop 604) with the same data copied within. Likewise, additional cycles are introduced within the shift cycle path due to an in-situ monitor circuit within an integrated circuit. As the number of in-situ monitor circuits in integrated circuits increases, the additional shift cycles result can introduce significant penalties to test time.

Figure 7:
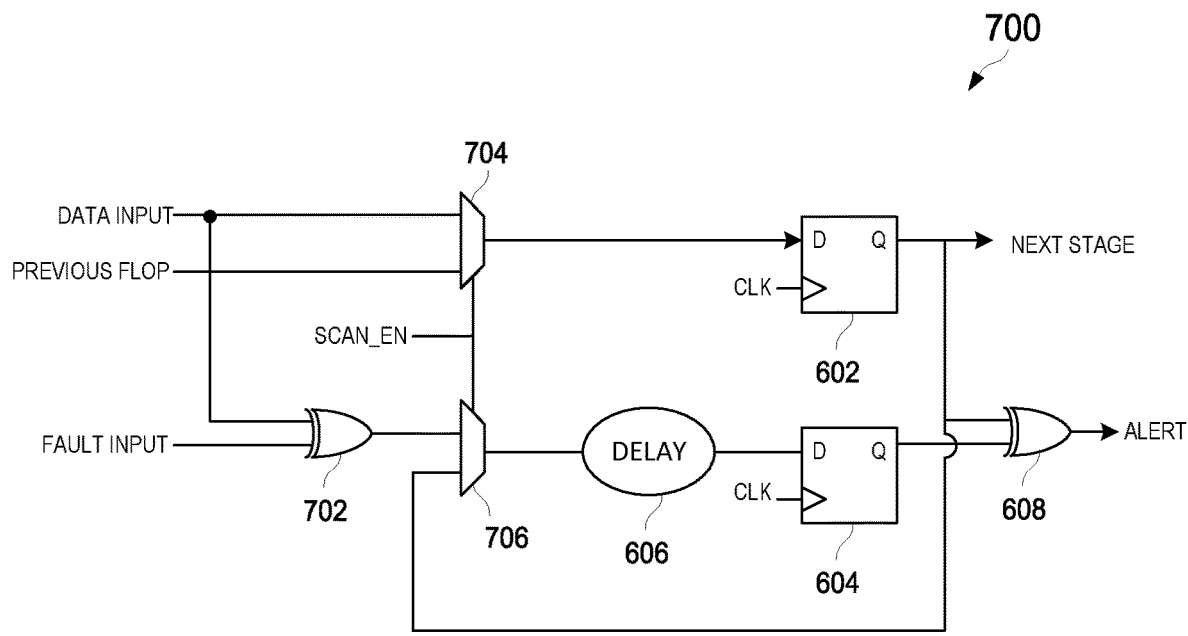
FIG. 7 is a schematic of an embodiment flop-based, in-situ monitor circuit.

FIG. 7 illustrates a schematic of an embodiment flop-based, in-situ monitor circuit 700. In-situ monitor circuit 700, in addition to the components previously discussed with respect to in-situ monitor circuit 600, includes a second XOR gate 702, a first multiplexer 704, and a second multiplexer 706, which may (or may not) be arranged as shown. Further, in-situ monitor circuit 700 may include additional components not shown. In-situ monitor circuit 700 is configured to operate under two modes: (i) a functional mode and (ii) a test mode.

The second XOR gate 702 has a first input terminal coupled to the test data signal (DATA INPUT). A second input terminal of the second XOR gate 702 is coupled to the fault input signal (FAULT INPUT), which provides coverage of the safety logic. The fault input signal (FAULT INPUT) tests logic under normal operating conditions, when, for example, aging is not adversely impacting the circuit. In embodiments, the fault input signal (FAULT INPUT) is provided and controlled by the test tool.

When the fault input signal (FAULT INPUT) is at a logic level low, the output of the second XOR gate 702 provides the test data signal (DATA INPUT) to the shadow flip-flop 604. During normal operating conditions, when the delay chain 606 provides the permissible delay, the regular flip-flop 602 and the shadow flip-flop 604 hold the same value and the output of XOR gate 608 is at a logic level low (i.e., alert signal (ALERT) is '0').

When the fault signal (FAULT INPUT) is at a logic level high, the output of the second XOR gate 702 provides an inverted test data signal ($\overline{\text{DATA INPUT}}$) to the shadow flip-flop 604. During normal operating conditions, when the delay chain 606 provides the permissible delay, the values latched in regular flip-flop 602 and shadow flip-flop 604 do not match, the output of XOR gate 608 is at a logic level high, and a timing error is detected (i.e., alert signal (ALERT) is '1').

In embodiments, test data signal (DATA INPUT) and fault input signal (FAULT INPUT) are generated by a test tool. In embodiments, second XOR gate 702 compares the test data signal (DATA INPUT) at the first input terminal to the fault input signal (FAULT INPUT) at the second input terminal. In embodiments, the output of the second XOR gate 702 is coupled to the data input (D) of the shadow flip-flop 604 through the delay chain 606.

In embodiments, each of first multiplexer 704 and second multiplexer 706 has two input terminals. The select terminal of first multiplexer 704 is coupled to the select terminal of second multiplexer 706, and is configured to receive a select signal (SCAN_EN). A first input terminal of first multiplexer 704 is configured to receive data from the previous stage (e.g., the previous scan flip-flop). A second input terminal of the first multiplexer 704 is configured to receive the test data signal (DATA INPUT). A first input terminal of second multiplexer 706 is configured to receive data from the output terminal of the second XOR gate 702. A second input terminal of the first multiplexer 704 is configured to receive the output signal from the output (Q) of the regular flip-flop 602. In embodiments, select signal (SCAN_EN) is generated by the test tool. The select signal (SCAN_EN) allows a selection between signals received at the input terminals of first multiplexer 704 and second multiplexer 706. During functional mode, select signal (SCAN_EN) may be provided by a controller of an integrated circuit implementing in-situ monitor circuit 700 or a controller coupled to in-situ monitor circuit 700.

During functional mode, the select signal (SCAN_EN) is set such that the first multiplexer 704 selects the data from the previous stage (e.g., the previous scan flip-flop) as the input to the data input (D) of regular flip-flop 602. Further, the select signal (SCAN_EN) is set such that the second multiplexer 706 selects the output signal from the output (Q) of the regular flip-flop 602 as the input to the delay chain 606. Thus, in functional mode, in-situ monitor circuit 700 operates substantially like in-situ monitor circuit 600.

During test mode, the select signal (SCAN_EN) is set such that the first multiplexer 704 selects the test data signal (DATA INPUT) as the input to the data input (D) of regular flip-flop 602. Moreover, select signal (SCAN_EN) is set such that the second multiplexer 706 selects the output of the second XOR gate 702 as the input to the delay chain 606.

Thus, to test the path that includes the regular flip-flop 602, test patterns are provided as the test data signal (DATA INPUT) to the regular flip-flop 602 and observed at the output (Q) of the regular flip-flop to expected results using, for example, a scan flip-flop. During the same shift cycle, the shadow flip-flop 604 is in shadow mode.

In embodiments, shadow flip-flop 604 is arranged as shadow logic (i.e., not directly accessed but retains valid data, which is received as a slightly delayed signal of the test data signal (DATA INPUT)). Thus, although the output (Q) of shadow flip-flop 604 is not observed using the same, for example, scan flip-flop used to test the regular flip-flop 602, a second scan flip-flop coupled to the XOR gate 608 can be used to observe the output (Q) of shadow flip-flop to provide test coverage for the path that includes the shadow flip-flop 604, without requiring an additional test cycle.

Figure 8:
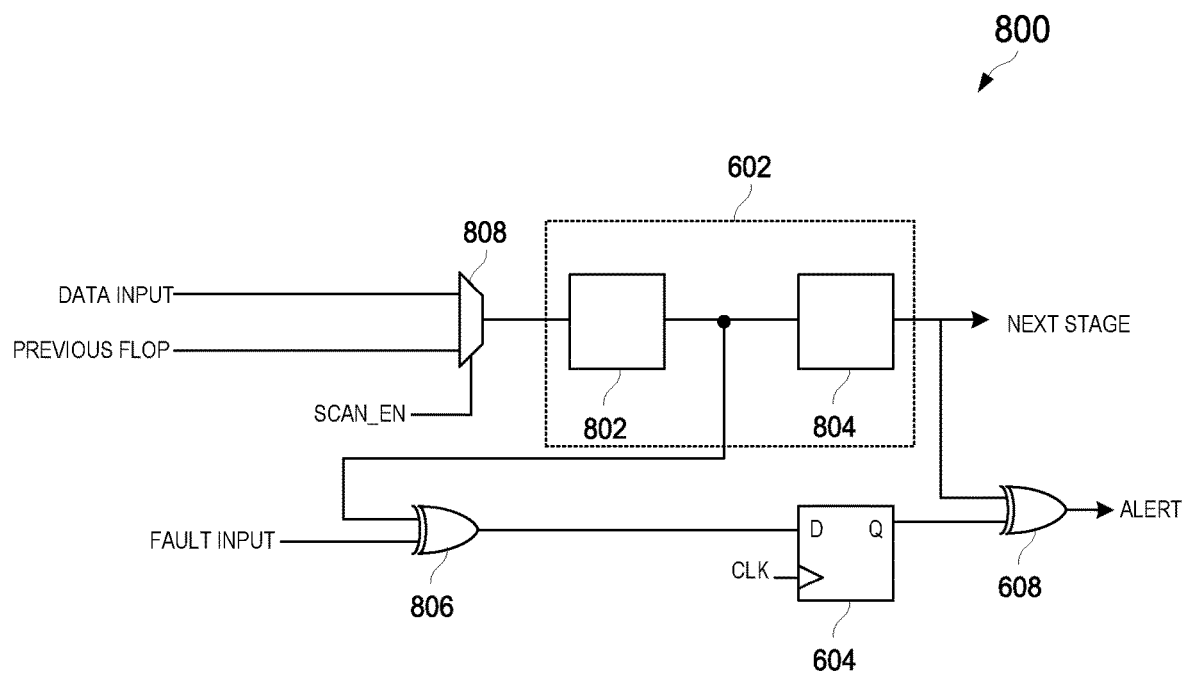
FIG. 8 is a schematic of an embodiment latch-based, in-situ monitor circuit.

FIG. 8 illustrates a schematic of an embodiment latch-based, in-situ monitor circuit 800. In-situ monitor circuit 800, in addition to the components previously discussed with respect to in-situ monitor circuit 600, includes a second XOR gate 806 and a multiplexer 808, which may (or may not) be arranged as shown. Unlike in-situ monitor circuit 600, in-situ monitor circuit 800 does not include delay chain 606. In-situ monitor circuit 800 may include additional components not shown. In in-situ monitor circuit 800, regular flip-flop 602 is represented by a first latch 802 and a second latch 804. However, it should be noted that this detailed representation does not change the operation of the regular flip-flop 602 but is merely an example. In-situ monitor circuit 800 operates under two modes: (i) a functional mode and (ii) a test mode.

In embodiments, multiplexer 808 has two input terminals. The select terminal of the multiplexer 808 is configured to receive a select signal (SCAN_EN). A first input terminal of multiplexer 808 is configured to receive data from the previous stage (PREVIOUS STAGE). A second input terminal of multiplexer 808 is configured to receive the test data signal (DATA INPUT).

In embodiments, select signal (SCAN_EN) is generated by the test tool. The select signal (SCAN_EN) allows a selection between signals received at the input terminals of the multiplexer 808. During functional mode, select signal (SCAN_EN) may be provided by a controller of an integrated circuit implementing in-situ monitor circuit 700 or a controller coupled to in-situ monitor circuit 700.

The input of first latch 802 of the regular flip-flop 602 is coupled to the output of the multiplexer 808. A first input terminal of the multiplexer 808 is configured to receive data from the previous stage. In contrast, the second terminal of the multiplexer 808 is configured to receive test data signal (DATA INPUT).

The second XOR gate 806 has a first input terminal coupled to the output of first latch 802 of the regular flip-flop 602. A second input terminal of second XOR gate 806 is coupled to the fault input signal (FAULT INPUT).

The second XOR gate 806 compares the slightly delayed data from the previous stage at the first input terminal to the fault input signal (FAULT INPUT) at the second input terminal. The output of the second XOR gate 806 is provided as an input to the shadow flip-flop 604. In contrast to in-situ monitor circuit 600, which utilizes the delay chain 606 to provide the delayed data from the previous stage, in-situ monitor circuit 800 generates the delayed data for the shadow flip-flop 604 from the output of the first latch 802 of the regular flip-flop 602.

During functional mode, the select signal (SCAN_EN) is set such that multiplexer 808 selects the data from the previous stage (PREVIOUS STAGE) as the input to the data input (D) of regular flip-flop 602. During functional mode, the fault input signal is set to logic level low (i.e., '0'). As such, the output of the second XOR gate 806 corresponds to the slightly delayed signal corresponding to the output of the first latch 802 of the regular flip-flop 602 (i.e., the output of the second XOR gate 806 only depends on the value of the output of the first latch 802). Thus, in functional mode, in-situ monitor circuit 800 operates substantially like in-situ monitor circuit 600.

During test mode, select signal (SCAN_EN) is set such that multiplexer 808 selects the test data signal (DATA INPUT) as the input to the first latch 802 of regular flip-flop 602. Thus, to test the path that includes the regular flip-flop 602, test patterns are provided as the test data signal (DATA INPUT) to the regular flip-flop 602 and observed at the output (Q) of the regular flip-flop to expected results using, for example, a scan flip-flop. During the same shift cycle, the shadow flip-flop 604 is in shadow mode.

In embodiments, shadow flip-flop 604 is arranged as shadow logic (i.e., not directly accessed but retains valid data, which is received as a slightly delayed signal of the test data signal (DATA INPUT)). Thus, although the output (Q) of shadow flip-flop 604 is not observed using the same, for example, scan flip-flop used to test the regular flip-flop 602, a second scan flip-flop coupled to the XOR gate 608 can be used to observe the output (Q) of shadow flip-flop to provide test coverage for the path that includes the shadow flip-flop 604, without requiring an additional test cycle.

Figure 9:
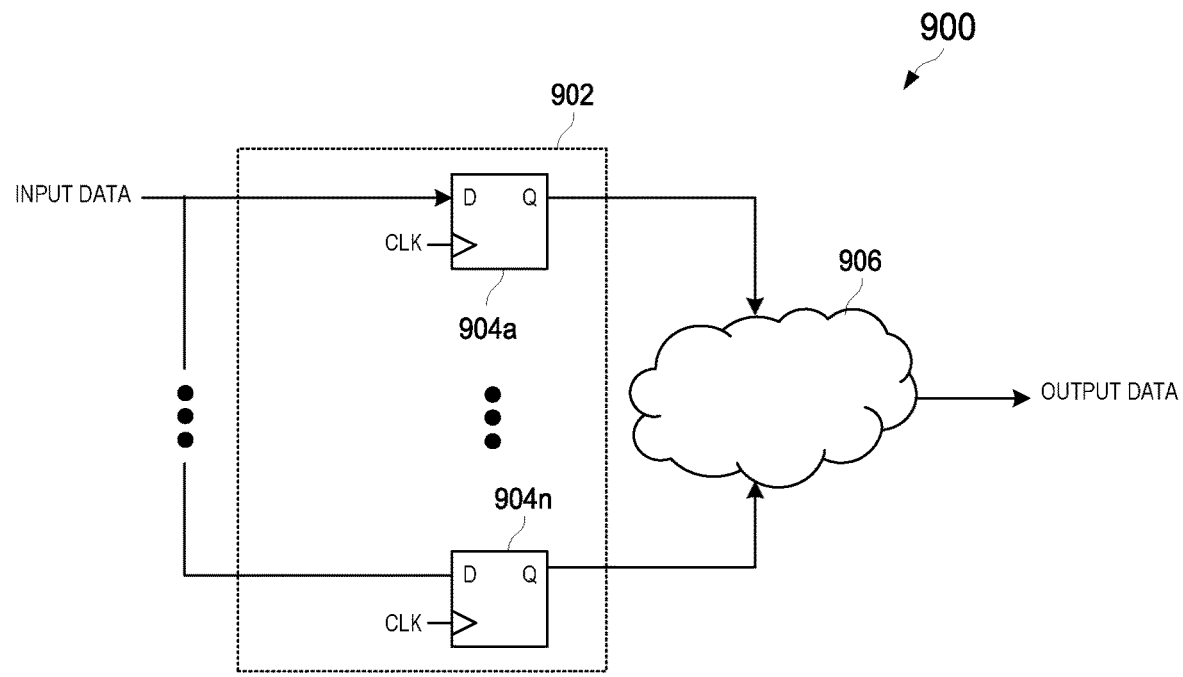
FIG. 9 is an example of an integrated circuit with at least one digital circuit having redundant flip-flops.

FIG. 9 illustrates an example of an integrated circuit 900 with at least one digital circuit 902 having redundant flip-flops 904a-n. As shown, in integrated circuit 900, the same data (INPUT DATA) is copied into each data input (D) of N number of redundant flip-flops 904a-n of digital circuit 902 and converge out as a single output (OUTPUT DATA) at a single node through the logic gates 906 coupled to the output (Q) of the N number of redundant flip-flops 904a-n of digital circuit 902.

In embodiments, the integrated circuit 900 is a circuit in a commercial or consumer application. In embodiments, the integrated circuit 900 is a circuit in an electronic device. In embodiments, the integrated circuit 900 is a circuit in a safety-critical system that utilizes redundant flip-flops 904a-n as a fault-tolerant design technique where single faults could lead to hazardous or unsafe conditions. In embodiments, the integrated circuit 900 is a circuit in a system that utilizes redundant flip-flops 904a-n as a security measure to protect systems and data from unauthorized attacks and breaches and monitor critical components of the system.

In embodiments, integrated circuit 900 is implemented in an automotive system to meet Automotive Safety Integrity Level (ASIL) standards. For example, the integrated circuit 900 may be part of an airbag, anti-lock brake, power steering, headlight and brake lights, cruise control, or an autonomous driving system, etc.

In embodiments, digital circuit 902 includes N number of redundant flip-flops 904a-n. In embodiments, the digital circuit 902 is a triple-voting flop, such as, for example, the triple-voting flop 500. In such embodiments, N is equal to three. In embodiments, digital circuit 902 is an in-situ monitor circuit, such as, for example, the flop-based, in-situ monitor circuit 700 or the latch-based, in-situ monitor circuit 800. In such embodiments, N equals any number greater than one.

Figure 10:
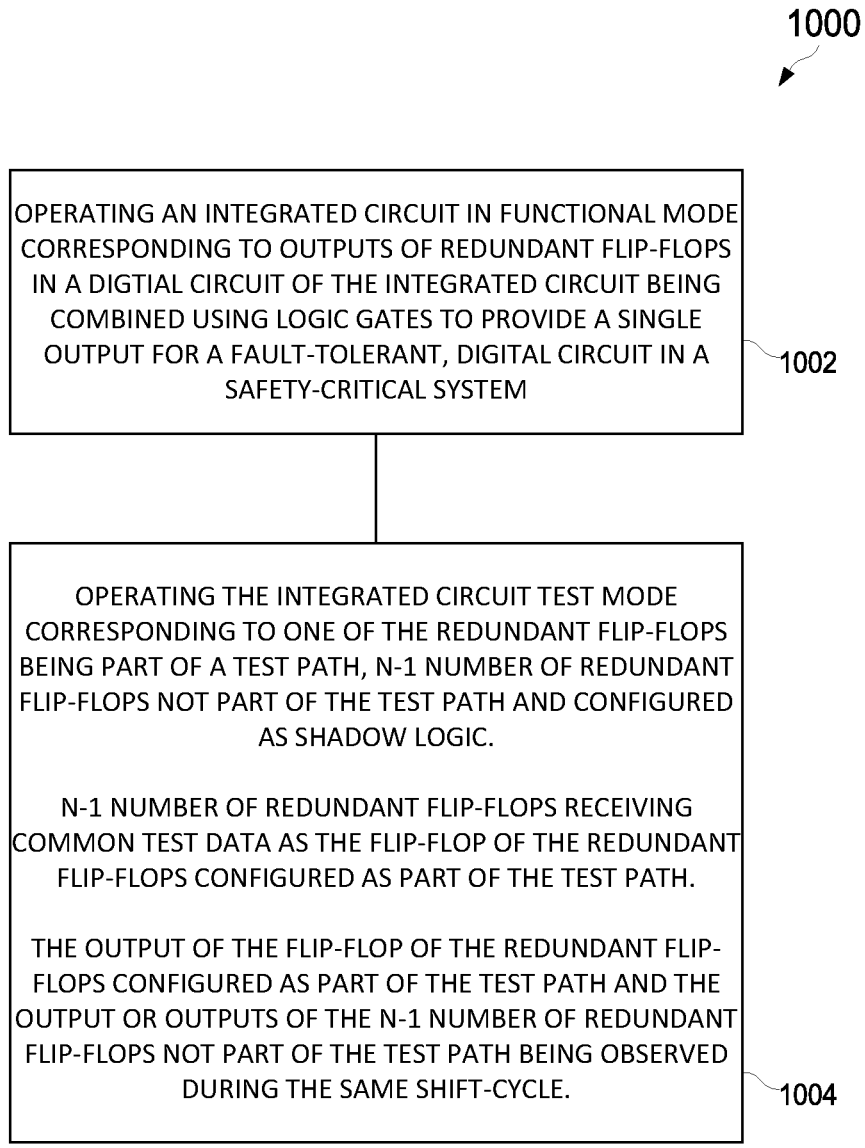
FIG. 10 is a flow chart of an embodiment method for operating the integrated circuit of FIG. 9 in accordance with the embodiment disclosed herein.

FIG. 10 illustrates a flow chart of an embodiment method 1000 for operating the integrated circuit 900 in accordance with the embodiment disclosed herein. In embodiments, the data input to each flip-flop of the redundant flip-flops 904a-n is a common digital signal (INPUT DATA). In embodiments, the data output from each flip-flop of the redundant flip-flops 904a-n is configured to have the same output (OUTPUT DATA) during the normal operating conditions of the digital circuit 902. In embodiments, during a functional mode of the digital circuit 902, the outputs of the redundant flip-flops 904a-n are combined using logic gates 906. In embodiments, during the functional mode of the digital circuit 902, the outputs of the redundant flip-flops 904a-n are compared using logic gates 906 and a single output (OUTPUT DATA) is determined to provide a fault-tolerant, digital circuit 902 in a safety-critical system.

At step 1102, the digital circuit 902 of the integrated circuit 900 is operating in functional mode. During the functional mode, the outputs of the redundant flip-flops 904a-n are combined using logic gates 906 and a single output (OUTPUT DATA) is determined to provide a fault-tolerant, digital circuit 902 in a safety-critical system.

At step 1104, the digital circuit 902 of the integrated circuit 900 is operating in test mode. During the test mode of the digital circuit 902, one of the redundant flip-flops 904a-n is part of a test path. In such embodiments, the N−1 number of redundant flip-flops 904a-n are not part of the test path and are configured as shadow logic. In embodiments, N−1 number of redundant flip-flops 904a-n receive the same test data as the flip-flop of the redundant flip-flops 904a-n that is configured as part of the test path. In embodiments, the output of the flip-flop of the redundant flip-flops 904a-n that is configured as part of the test path and the output or outputs of the N−1 number of redundant flip-flops 904a-n that are not part of the test path are observed during the same shift-cycle.

Advantageously, during the test mode, all redundant flip-flops 904a-n are tested during the same shift cycle by using smart scan connectivity and ordering to save test cycles. In embodiments, the proposed test configuration does not impact the functional path of the digital circuit 902. In embodiments, terminal scan paths are re-used for scan enable over-ride and for scan chain ordering. In embodiments, arranging the N−1 number of redundant flip-flops 904a-n during the test mode minimizes scan stitching. In embodiments, any additional logic or nodes as part of arranging the N−1 number of redundant flip-flops 904a-n during the test mode, as proposed herein, are tested. In embodiments where the digital circuit 902 is a triple-voting flop, one scan multiplexer is saved for a cell of the triple-voting flop cells.

In embodiments where the digital circuit 902 is a triple-voting flop, shift-length reduction is achieved by using shadow logic. The shadow logic may be inserted at the synthesis/gate level or RTL-level in embodiments through a connect/disconnect script. The script can be easily updated to include the new scan connectivity in such embodiments. The scan inputs on the triple-voting flop terminals (i.e., adjacent flip-flops to the triple-voting flops) can be extracted by the script and used for gating purposes.

In various embodiments, the digital circuit 902 achieves complete coverage while minimizing test cycles by implementing shadow logic on N−1 number of flip-flops of the N number of redundant flip-flops. In embodiments, the proposed arrangement for test mode has minimal overhead.

It is noted that all steps outlined in the flow charts of the various methods are not necessarily required and can be optional. Further, changes to the arrangement of the steps, removal of one or more steps and path connections, and addition of steps and path connections are similarly contemplated.

A first aspect relates to a digital circuit that includes N number of redundant flip-flops. Each of the N number of redundant flip-flops has a data input coupled to a common data signal. The digital circuit is configured to operate in a functional mode corresponding to the regular operation of the digital circuit and a test mode corresponding to the testing of various paths of the digital circuit. During the functional mode, the digital circuit is configured to combine a functional output signal of each of the N number of redundant flip-flops using logic gates and provide a single functional output signal in a fault-tolerant, safety-critical system based on the combining. During the test mode, the digital circuit is configured to arrange a first flip-flop of the N number of redundant flip-flops as part of a test path; arrange N−1 number of the N number of redundant flip-flops as shadow logic by bypassing the N−1 number of the N number of redundant flip-flops from the test path, the N number of redundant flip-flops receiving a test pattern at the common data signal; observe a test output signal at an output terminal of the first flip-flop to determine faults within a test path comprising the first flip-flop; and observe test output signals of each of the N−1 number of redundant flip-flops to determine faults within the N−1 number of redundant flip-flops, the test output signal at the output terminal of the first flip-flop and the test output signals of each of the N−1 number of redundant flip-flops are observed at a same test cycle.

In a first implementation form of the digital circuit according to the first aspect as such, the digital circuit is a triple-voting flip-flop and N equals three.

In a second implementation form of the digital circuit according to the first aspect as such or any preceding implementation form of the first aspect, the digital circuit is an in-situ monitor circuit.

In a third implementation form of the digital circuit according to the first aspect as such or any preceding implementation form of the first aspect, N equals two.

In a fourth implementation form of the digital circuit according to the first aspect as such or any preceding implementation form of the first aspect, the in-situ monitor circuit is a flop-based or a latch-based flip-flop, and wherein the in-situ monitor circuit is a canary type in-situ monitor circuit used to detect timing errors in an integrated circuit.

In a fifth implementation form of the digital circuit according to the first aspect as such or any preceding implementation form of the first aspect, the digital circuit is part of an integrated circuit in an automotive system. The automotive system is an airbag, an anti-lock brake, a power steering, a headlight and brake light, a cruise control, or an autonomous driving system.

In a sixth implementation form of the digital circuit according to the first aspect as such or any preceding implementation form of the first aspect, an operation of the N−1 number of the N number of redundant flip-flops is in accordance with a shadow logic inserted at a synthesis/gate level through a connect/disconnect script.

A second aspect relates to an integrated circuit that includes a digital circuit. The digital circuit includes N number of redundant flip-flops. Each of the N number of redundant flip-flops has a data input coupled to a common data signal. The digital circuit is configured to operate in a functional mode corresponding to a regular operation of the digital circuit and a test mode corresponding to testing of various paths of the digital circuit. During the functional mode, the digital circuit is configured to combine a functional output signal of each of the N number of redundant flip-flops using logic gates and provide a single functional output signal in a fault-tolerant, safety-critical system based on the combining. During the test mode, the digital circuit is configured to arrange a first flip-flop of the N number of redundant flip-flops as part of a test path; arrange N−1 number of the N number of redundant flip-flops as shadow logic by bypassing the N−1 number of the N number of redundant flip-flops from the test path, the N number of redundant flip-flops receiving a test pattern at the common data signal; observe a test output signal at an output terminal of the first flip-flop to determine faults within a test path comprising the first flip-flop; and observe test output signals of each of the N−1 number of redundant flip-flops to determine faults within the N−1 number of redundant flip-flops, the test output signal at the output terminal of the first flip-flop and the test output signals of each of the N−1 number of redundant flip-flops are observed at a same test cycle.

In a first implementation form of the integrated circuit according to the second aspect as such, the digital circuit is a triple-voting flip-flop and N equals three.

In a second implementation form of the integrated circuit according to the second aspect as such or any preceding implementation form of the second aspect, the digital circuit is an in-situ monitor circuit.

In a third implementation form of the integrated circuit according to the second aspect as such or any preceding implementation form of the second aspect, N equals two.

In a fourth implementation form of the integrated circuit according to the second aspect as such or any preceding implementation form of the second aspect, the in-situ monitor circuit is a flop-based or a latch-based flip-flop. The in-situ monitor circuit is a canary implementation of an in-situ monitor circuit used to detect timing errors in the integrated circuit.

In a fifth implementation form of the integrated circuit according to the second aspect as such or any preceding implementation form of the second aspect, the integrated circuit is an integrated circuit in an automotive system. The automotive system is an airbag, an anti-lock brake, a power steering, a headlight and brake light, a cruise control, or an autonomous driving system.

In a sixth implementation form of the integrated circuit according to the second aspect as such or any preceding implementation form of the second aspect, an operation of the N−1 number of the N number of redundant flip-flops is in accordance with a shadow logic inserted at a synthesis/gate level through a connect/disconnect script.

A third aspect relates to a method of operating a digital circuit having N number of redundant flip-flops, each of the N number of redundant flip-flops having a data input coupled to a common data signal. The method includes operating the digital circuit in a functional mode corresponding to a regular operation of the digital circuit and operating the digital circuit in a test mode corresponding to testing various paths of the digital circuit. During the functional mode, the method includes combining a functional output signal of each of the N number of redundant flip-flops using logic gates and providing a single functional output signal in a fault-tolerant, safety-critical system based on the combining. During the test mode, the method includes arranging a first flip-flop of the N number of redundant flip-flops as part of a test path; arranging N−1 number of the N number of redundant flip-flops as shadow logic by bypassing the N−1 number of the N number of redundant flip-flops from the test path, the N number of redundant flip-flops receiving a test pattern at the common data signal; observing a test output signal at an output terminal of the first flip-flop to determine faults within a test path comprising the first flip-flop; and observing test output signals of each of the N−1 number of redundant flip-flops to determine faults within the N−1 number of redundant flip-flops, wherein observing the test output signal at the output terminal of the first flip-flop and the test output signals of each of the N−1 number of redundant flip-flops are during a same test cycle.

In a first implementation form of the method according to the third aspect as such, the digital circuit is a triple-voting flip-flop and N equals three.

In a second implementation form of the method according to the third aspect as such or any preceding implementation form of the third aspect, the digital circuit is an in-situ monitor circuit.

In a third implementation form of the method according to the third aspect as such or any preceding implementation form of the third aspect, N equals two.

In a fourth implementation form of the method according to the third aspect as such or any preceding implementation form of the third aspect, the in-situ monitor circuit is a flop-based or a latch-based flip-flop. The in-situ monitor circuit is a canary type in-situ monitor circuit used to detect timing errors in an integrated circuit.

In a fifth implementation form of the method according to the third aspect as such or any preceding implementation form of the third aspect, the digital circuit is part of an integrated circuit in an automotive system. The automotive system is an airbag, an anti-lock brake, a power steering, a headlight and brake light, a cruise control, or an autonomous driving system.

Although the description has been described in detail, it should be understood that various changes, substitutions, and alterations may be made without departing from the spirit and scope of this disclosure as defined by the appended claims. The same elements are designated with the same reference numbers in the various figures. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

The specification and drawings are, accordingly, to be regarded simply as an illustration of the disclosure as defined by the appended claims, and are contemplated to cover any and all modifications, variations, combinations, or equivalents that fall within the scope of the present disclosure.

What is claimed is:

1. A digital circuit, comprising:
N number of redundant flip-flops, each of the N number of redundant flip-flops having a data input coupled to a common data signal, the digital circuit configured to operate in a functional mode corresponding to a regular operation of the digital circuit and a test mode corresponding to testing of various paths of the digital circuit,
wherein the digital circuit, during the functional mode, is configured to:
combine a functional output signal of each of the N number of redundant flip-flops using logic gates; and
provide a single functional output signal in a fault-tolerant, safety-critical system based on the combining, and wherein the digital circuit, during the test mode, is configured to:
arrange a first flip-flop of the N number of redundant flip-flops as part of a test path;
arrange N−1 number of the N number of redundant flip-flops as shadow logic by bypassing the N−1 number of the N number of redundant flip-flops from the test path, the N number of redundant flip-flops receiving a test pattern at the common data signal;
observe a test output signal at an output terminal of the first flip-flop to determine faults within a test path comprising the first flip-flop; and
observe test output signals of each of the N−1 number of redundant flip-flops to determine faults within the N−1 number of redundant flip-flops, the test output signal at the output terminal of the first flip-flop and the test output signals of each of the N−1 number of redundant flip-flops are observed at a same test cycle.

2. The digital circuit of claim 1, wherein the digital circuit is a triple-voting flip-flop and N equals three.

3. The digital circuit of claim 1, wherein the digital circuit is an in-situ monitor circuit.

4. The digital circuit of claim 3, wherein N equals two.

5. The digital circuit of claim 3, wherein the in-situ monitor circuit is a flop-based or a latch-based flip-flop, and wherein the in-situ monitor circuit is a canary type in-situ monitor circuit used to detect timing errors in an integrated circuit.

6. The digital circuit of claim 1, wherein the digital circuit is part of an integrated circuit in an automotive system, wherein the automotive system is an airbag, an anti-lock brake, a power steering, a headlight and brake light, a cruise control, or an autonomous driving system.

7. The digital circuit of claim 1, wherein an operation of the N−1 number of the N number of redundant flip-flops is in accordance with a shadow logic inserted at a synthesis/gate level through a connect/disconnect script.

8. An integrated circuit comprising a digital circuit, the digital circuit comprising:
N number of redundant flip-flops, each of the N number of redundant flip-flops having a data input coupled to a common data signal, the digital circuit configured to operate in a functional mode corresponding to a regular operation of the digital circuit and a test mode corresponding to testing of various paths of the digital circuit,
wherein the digital circuit, during the functional mode, is configured to:
combine a functional output signal of each of the N number of redundant flip-flops using logic gates; and
provide a single functional output signal in a fault-tolerant, safety-critical system based on the combining, and
wherein the digital circuit, during the test mode, is configured to:
arrange a first flip-flop of the N number of redundant flip-flops as part of a test path;
arrange N−1 number of the N number of redundant flip-flops as shadow logic by bypassing the N−1 number of the N number of redundant flip-flops from the test path, the N number of redundant flip-flops receiving a test pattern at the common data signal;
observe a test output signal at an output terminal of the first flip-flop to determine faults within a test path comprising the first flip-flop; and
observe test output signals of each of the N−1 number of redundant flip-flops to determine faults within the N−1 number of redundant flip-flops, the test output signal at the output terminal of the first flip-flop and the test output signals of each of the N−1 number of redundant flip-flops are observed at a same test cycle.

9. The integrated circuit of claim 8, wherein the digital circuit is a triple-voting flip-flop and N equals three.

10. The integrated circuit of claim 8, wherein the digital circuit is an in-situ monitor circuit.

11. The integrated circuit of claim 10, wherein N equals two.

12. The integrated circuit of claim 10, wherein the in-situ monitor circuit is a flop-based or a latch-based flip-flop, and wherein the in-situ monitor circuit is a canary implementation of an in-situ monitor circuit used to detect timing errors in the integrated circuit.

13. The integrated circuit of claim 8, wherein the integrated circuit is an integrated circuit in an automotive system, wherein the automotive system is an airbag, an anti-lock brake, a power steering, a headlight and brake light, a cruise control, or an autonomous driving system.

14. The integrated circuit of claim 8, wherein an operation of the N−1 number of the N number of redundant flip-flops is in accordance with a shadow logic inserted at a synthesis/gate level through a connect/disconnect script.

15. A method of operating a digital circuit having N number of redundant flip-flops, each of the N number of redundant flip-flops having a data input coupled to a common data signal, the method comprising:
operating the digital circuit in a functional mode corresponding to a regular operation of the digital circuit, wherein, during the functional mode, the method comprises:
combining a functional output signal of each of the N number of redundant flip-flops using logic gates; and
providing a single functional output signal in a fault-tolerant, safety-critical system based on the combining; and
operating the digital circuit in a test mode corresponding to testing of various paths of the digital circuit, wherein, during the test mode, the method comprises:
arranging a first flip-flop of the N number of redundant flip-flops as part of a test path,
arranging N−1 number of the N number of redundant flip-flops as shadow logic by bypassing the N−1 number of the N number of redundant flip-flops from the test path, the N number of redundant flip-flops receiving a test pattern at the common data signal,
observing a test output signal at an output terminal of the first flip-flop to determine faults within a test path comprising the first flip-flop, and
observing test output signals of each of the N−1 number of redundant flip-flops to determine faults within the N−1 number of redundant flip-flops, wherein observing the test output signal at the output terminal of the first flip-flop and the test output signals of each of the N−1 number of redundant flip-flops are during a same test cycle.

16. The method of claim 15, wherein the digital circuit is a triple-voting flip-flop and N equals three.

17. The method of claim 15, wherein the digital circuit is an in-situ monitor circuit.

18. The method of claim 17, wherein N equals two.

19. The method of claim 17, wherein the in-situ monitor circuit is a flop-based or a latch-based flip-flop, and wherein the in-situ monitor circuit is a canary type in-situ monitor circuit used to detect timing errors in an integrated circuit.

20. The method of claim 15, wherein the digital circuit is part of an integrated circuit in an automotive system, wherein the automotive system is an airbag, an anti-lock brake, a power steering, a headlight and brake light, a cruise control, or an autonomous driving system.

\* \* \* \* \*